Dec. 9, 1969 W. O. ROGERS ET AL 3,482,419

PROCESS FOR FABRICATING HERMETIC GLASS SEALS

Original Filed Jan. 3, 1966

INVENTOR
WILLIAM O. ROGERS
CHAN H. WANG
E. Mickey Hubbard
ATTORNEY

United States Patent Office 3,482,419
Patented Dec. 9, 1969

3,482,419
PROCESS FOR FABRICATING HERMETIC GLASS SEALS

William O. Rogers and Chan Huan Wang, Richardson, Tex., assignors to Texas Instruments Incorporated, Dallas, Tex., a corporation of Delaware Continuation of application Ser. No. 518,214, Jan. 3, 1966. This application Nov. 13, 1968, Ser. No. 775,561
Int. Cl. C03b *23/20, 27/02*
U.S. Cl. 65—36 8 Claims

ABSTRACT OF THE DISCLOSURE

A process is disclosed for effecting the formation of a glass seal between two spaced members utilized in packaging an electrical device by filling the space between the members with a liquid slurry containing glass particles, drying the slurry so as to provide the glass particles in the form of a particulate mass within the space, and then fusing this particulate glass mass so as to form a solid glass seal between the members prior to installing the electrical device in the desired position adjacent the members.

This application is a continuation of copending application Ser. No. 518,214, filed Jan. 3, 1966, now abandoned.

This invention relates generally to glass seals, and more particularly, but not by way of limitation, relates to an improved process for fabricating hermetically sealed packages for semiconductor devices.

It is vitally important that all semiconductor devices be placed in a hermetically sealed package so that the environment of the device can be controlled. If the environment is not properly controlled, the devices are highly unstable and their useful life unpredictable and usually very short. Since all semiconductor devices have at least two leads, and most have three or more, at least one electrical lead must of necessity extend from the semiconductor device out through the package, yet be electrically insulated from the package. It is customary to fabricate semiconductor packages from a conductive metal alloy known by the trade name "Kovar." Glass is then disposed between the conductive package and the lead to electrically insulate the lead and hermetically seal the space between the lead and the package, and in most cases mechanically support the lead.

The packaging of so-called integrated or solid circuit networks having a number of semiconductor components formed in situ on a single semiconductor substrate is particularly complicated due to the fact that a large number of electrical leads, for example from ten to twenty, must extend from the semiconductor chip through the package for connection to an external circuit. A standard "flat pack," which may be on the order of 0.250 inch long, 0.125 inch wide and 0.03 inch deep, often has fourteen leads, each of which must be electrically isolated from the package. In the fabrication of such a flat pack, a rectangular frame is formed integral with the leads to support the leads in the proper relative positions by stamping both the frame and leads from a metal sheet. Then a ring frame having openings in the side walls for receiving the leads and a base plate are positioned on either side of the leads and welded together such that each lead extends through the proper opening in the ring frame into the interior of the package. Each lead frame, ring frame and base plate assembly is handled individually. Then sixteen of the assemblies are manually loaded into a precision graphite boat which holds the leads in proper relationship with respect to the base plate and ring frame. A glass preform, which is a rectangular chip of glass sized to fit between the ends of the leads, and a copper plug are successively placed within the ring frame of each assembly.

A lid is then placed over the sixteen assemblies on the graphite boat and a separate nickel weight placed in position to bear on each of the copper plugs to thus load each glass preform with a separate weight. The loaded boat is then passed through a fusing furnace where each glass preform melts and is forced outwardly by the weight on the copper plug around the leads and is partially extruded through the openings between the leads and the base plate and ring frame. In order to insure that the space between the leads and the ring frame and base plate are completely filled, the glass preform contains an excess volume of glass which is squeezed out of the package and forms around the leads. Next the graphite boat is manually unloaded, with each assembly being individually handled, the copper plug is chemically removed, and the excess glass is sandblasted from the inside of the package to expose the ends of the leads and the central portion of the inside surface of the base plate. The glass around the roots of the leads outside the package is also sandblasted away to prevent the glass from being broken when the leads are bent. The leads tend to be weakened by this sandblasting process. After plating and inspection, the network semiconductor chip is bonded to the base plate by a suitable glass adhesive and electrical connections made between expanded contact pads on the semicondutcor chip and the exposed ends of the leads on the inside of the packages by small wires. Then a lid is welded over the top of the ring frame to complete the package. In addition to requiring precision formed graphite boats, glass preforms, copper plugs and nickel weights, this process does not readily lend itself to automation and requires an excess of manual labor which is slow and costly.

An important object of this invention is to provide an improved process for making a glass seal, and more particularly for fabricating hermetically sealed packages for semiconductor devices.

Another very important object is to provide a process for making glass seals which can be easily automated and which is therefore more economical.

A further object of the invention is to provide a process for fabricating integrated network packages which is considerably faster and eliminates the precision graphite boat, glass preforms, copper plugs, and nickel weights heretofore used and which is therefore considerably more economical.

These and other objects are accomplished by using a liquid to transport glass particles into the spaces to be sealed, evaporating the liquid to leave the glass particles in place, and then fusing the glass particles to form the desired solid glass seal. More specifically, a slurry comprised of finely ground glass and a suitable evaporable liquid, such as water, is merely placed in the ring frame, base plate and lead frame assembly. The surface tension of the slurry causes the slurry to carry the glass particles into the openings between the leads, ring frame and base plate. Then when the water is evaporated, a particulate glass solid is left in the desired spaces to be filled. The particulate glass solid is fused to form a solid glass seal and the excess glass sandblasted away to expose the ends of the leads and the center portion of the base plate.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

Figures 1, 2:
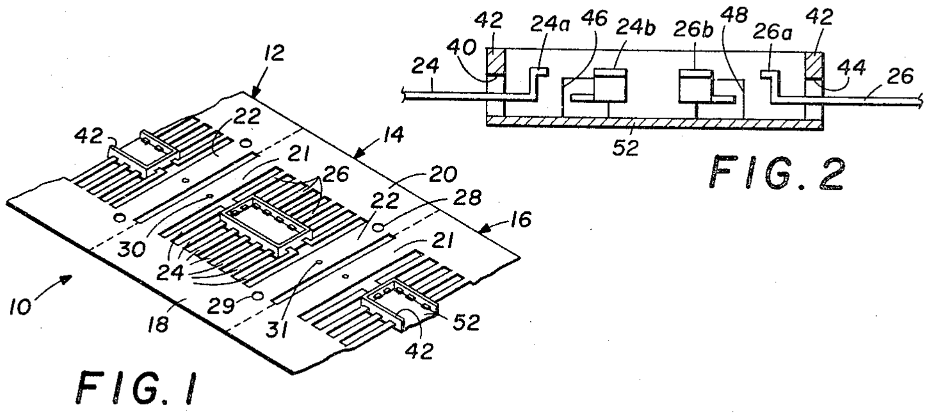
FIGURE 1 is a somewhat perspective view showing a portion of a strip of lead frames with the base plates and ring frames welded in position prior to the application of the glass slurry in accordance with the process of the present invention.
FIGURE 2 is a transverse sectional view of one of the assemblies shown in FIGURE 1.

Referring now to the drawings, and in particular to FIGURE 1, a ring frame strip 10 may be stamped from 4 mil thick metal to form a number of rectangular lead frames indicated generally by the reference numerals 12, 14 and 16, only half of the frames 12 and 16 being shown. Any number of lead frames may be so formed, although typically only eight are formed on a single strip. Each of the lead frames is comprised of a portion of the longitudinally extending strips 18 and 20, which interconnect the lead frames, and transverse strips 21 and 22 extending between the two longitudinal strips. As illustrated, seven leads 24 extend inwardly from the strip 18 and seven leads 26 extend inwardly from the strip 20. The strip is also provided with precisely located holes 28, 29, 30 and 31 for orientation and indexing purposes. The five middle leads 24 extend through openings 40 formed in one side of a ring frame 42 and are bent upwardly and then back toward the center of the ring frame 42 to provide end surfaces 24*a*. The five middle leads 26 similarly extend through openings 44 in the other side of ring frame 42 and terminate at end surfaces 26*a*. The two outer leads 24 extend through openings 46 in opposite ends of the ring frame 42 and terminate at end surfaces 24*b*, and the two outer leads 26 extend through openings 48 in opposite ends of the ring frame 42 and terminate at end surfaces 26*b*. The assembly comprised of the lead frame 14, the ring frame 42, and the base plate 52 is assembled by stitch welding the base plate 52 to the ring frame 42 after the ends of the leads are positioned in the openings of the ring frame, and is degassed and oxidized prior to making the glass seal in accordance with the process of the present invention.

The metal most often used to form the ring frame strip 10, ring frames 42 and base plates 52 is a metal alloy known by the trade name "Kovar." This alloy is wet by molten glass and has the same temperature expansion coefficient as certain hard glasses frequently used to make a seal, and therefore is particularly useful in making glass to metal seals. These alloys typically comprise 54% iron, 28% nickel, 18% cobalt, or 20% nickel, 17% cobalt, 0.2% manganese and the remainder iron.

Figure 3:
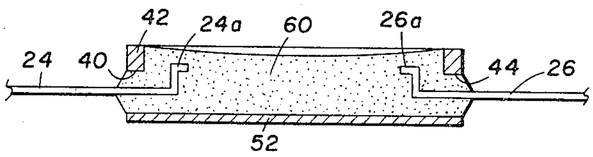
FIGURE 3 is a sectional view similar to FIGURE 2 showing the assembly after the application of a glass slurry.

In accordance with the process of the present invention, the lead frame-ring frame-base plate assembly illustrated in FIGURE 2 is placed in a suitable support which orients the leads in proper relationship to the ring frame and base plate. Then the assembly is filed with a liquid slurry 60 substantially as illustrated in FIGURE 3. It will be noted that the slurry 60 passes into the openings 40 and 44 and envelops the leads 24 and 26. The slurry 60 is a suspension of finely ground glass particles in water. The particular slurry presently being used by the assignee of this invention is ten parts glass to six parts distilled water. No other additive, binder or suspension agent is required. The glass is Corning Glass No. 7052, a borosilicate glass, which has been wet ball milled for ten hours until about 50% of the particles range in size from four to ten microns in diameter as determined by a Mine Safety Appliance Company centrifugal type particle size analyzer, with a somewhat even distribution within this range. Some data indicates that if more than about 50% of the particles are greater than ten microns, the final glass product tends to contain bubbles which are undesirable. Also, if the particle sizes are too large, the glass particles tend to settle out like sand and are not carried by the water and distributed as desired. There does not appear to be a minimum limit on the size of the particles. The viscosity of the slurry being used ranges from 11 to 13 centipoises as measured by a Brookfield viscometer using spindle #10. The surface energy is from 65–75 dynes/cm. as measured by a Fisher surface tensiomat. It is to be understood, however, that the invention, within its broader aspects, is not limited to any particular type of glass, to any particular particle size, or to any particular ratio of liquid and glass. In order to achieve the desired results, however, there must be an adequate volume of glass particles within the liquid to fill the spaces to be sealed after the liquid is evaporated, and the glass particles must be sufficiently small to be carried into the cracks, crevices and openings by the surface tension of the slurry. The viscosity and surface tension of the slurry must be chosen so as to penetrate the openings to be sealed, yet remain in the opening once the opening is filled. An important advantage of the invention is that the individual assemblies can easily be filled with slurry by a machine which automatically indexes the support for a strip of assemblies past a filling station.

Figure 4:
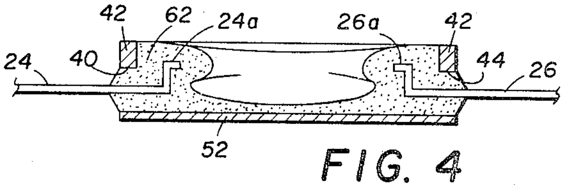
FIGURE 4 is a sectional view similar to FIGURE 3 showing the assembly after the glass slurry is dried to form a particulate glass mass.
Figure 5:
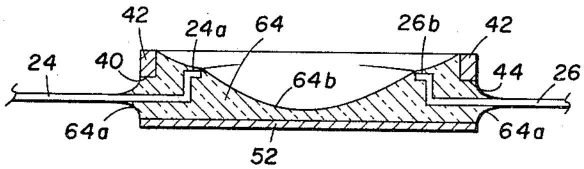
FIGURE 5 is a sectional view similar to FIGURE 4 showing the assembly after the particulate glass mass is fused to form a solid glass seal.

Immediately after the assemblies are filled with the slurry 60, the assemblies are transferred to a conveyor which passes through an oven operating at about 70–80° C. to evaporate the water from the slurry. As the water evaporates, the glass particles coagulate into a particulate mass 62 having a cross section substantially as illustrated in FIGURE 4. It will be noted that the particulate glass remains solid in the openings 40 and 44 around the leads 24 and 26 and also covers over the tips 24*a* and 26*a* of the leads. The particulate mass 62 is sufficiently solid to withstand ordinary handling without crumbling. Next the units are transferred to graphite boats, which support the leads 24 and 26 in proper relationship to the base plate 52 and ring frame 42 and the boat passed through a fusing furnace operating at about 925° C. A fusing cycle of about 1.5 hours is typical. The glass particles are then fused together and form a solid glass seal 64 having a cross section substantially as illustrated in FIGURE 5. It will be noted that the solid glass seal completely fills the spaces between the leads and the ring frame 42 and base plate 52 and also covers the ends 24*a* and 24*b* of the leads and the center of the base plate. Because of the greater surface tension of the glass, the glass also tends to coat the roots of the leads 24 and 26 further from the ring frame as indicated at 64*a*. Even so, the amount of glass 64*a* is less than the amount of glass produced with the conventional process where the glass is extruded outwardly through the openings 40, 44, 46, and 48 by the weight on the copper plug on the glass between the ends of the leads 24 and 26. Also, the amount of glass over the ends 24*a* and 26*b* of the leads is less, although the amount of glass 64*b* over the center of the base plate 52 is slightly greater.

Figure 6:
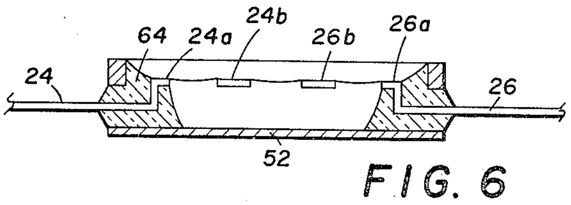
FIGURE 6 is a sectional view similar to FIGURE 5 showing the assembly after the excess glass has been sandblasted away.
Figure 7:
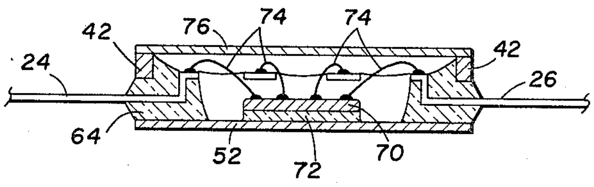
FIGURE 7 is a sectional view similar to FIGURE 6 showing a complete package with a solid circuit chip encapsulated therein.

Next the excess glass 64 is removed using conventional sandblasting techniques to expose the center of the base plate 52 and the ends 24*a*, 24*b*, 26*a* and 26*b* of the leads, and remove the excess glass 64*a* from the root of the leads substantially as illustrated in FIGURE 6. The package is then ready for insepction and plating and ultimately installation of the semiconductor chip in the conventional manner. This entails cementing the chip 70 to the exposed inside surface of the base plate 52 by a suitable glass adhesive 72, and then bonding lead wires 74 from the expanding contact pads on the chip 70 to the ends of the respective leads. Then a lid 76 is welded around the top of the ring frame 42 in the conventional manner to complete the hermetically sealed package. When the lead frame is subsequently cut away from the leads 24 and 26, the glass sealing material 64 mechanically holds the leads in place, electrically insulates the leads from the remainder of the package and hermetically seals the package so that the ambient within the package can be controlled.

From the above description it will be noted that the surface tension of the liquid in the slurry is used to advantage to transport the glass particles into the spaces to be sealed. Then as the liquid dries, the surface tension not only holds the particles in the spaces, but tends to transport additional particles into the spaces and firmly pack the particles into a compact particulate mass. However, it is to be understood that within the broader aspects of the invention, the slurry may be thick or more viscous, even to a consistency of paste, in which case the slurry would be forced by pressure into the spaces to be sealed, rather than by the surface tension of the liquid.

Although the process of the present invention has been described in connection with a standard semiconductor network flat pack, it is to be understood that the process is applicable to the fabrication of many other seals, and in particular to other glass-metal seals.

What is claimed is:

1. In a process of fabricating a hermetically sealed container for an electrical device of the type having at least one electrically conductive lead passing through the container but electrically insulated therefrom, including the following steps:

(a) positioning at least one electrically conductive lead within a respective opening formed in said container so that said lead is spaced from the edges of said opening;

(b) placing a preselected quantity of a liquid and particulate glass slurry within said container so as to at least cover said respective opening, said slurry having a viscosity and surface tension sufficient to penetrate and remain within the space between said one lead and respective opening;

(c) removing the liquid from said slurry to produce a particulate glass mass within at least the space between said one lead and respective opening;

(d) fuzing said particulate glass mass to produce a solid glass mass within at least the space between said one lead and respective opening to produce a desired space within said container; and (e) inserting an electrical device within said desired space and connecting said electrical device to said one lead.

2. In a process of fabricating a hermetically sealed electrically conductive container for an electrical device of the type having at least one electrically conductive lead positioned within a respective opening formed in said container but electrically insulated therefrom, including the following steps:

(a) placing a preselected quantity of a liquid and particulate glass slurry within said container so as to at least cover said respective opening, said slurry having a viscosity and surface tension sufficient to penetrate and remain within the space between said one lead and respective opening;

(b) removing the liquid from said slurry to produce a particulate glass mass within at least the space between said one lead and respective opening;

(c) fuzing said particulate glass mass to produce a solid glass mass within at least the space between said one lead and respective opening and to produce a desired space within said container; and (d) inserting an electrical device within said desired space connecting said electrical device to said one lead.

3. The process defined in claim 2 wherein said liquid is water.

4. The process defined in claim 3 wherein said water and glass slurry is comprised of about ten parts particulate glass and about six parts water, and about fifty percent of the glass particles are between about four microns and about ten microns in diameter.

5. A process for fabricating a hermetically sealed electrically conductive container for an electrical device of the type having at least one electrically conductive lead positioned within a respective opening formed in said container but electrically insulated therefrom, comprising the following steps:

(a) placing a preselected quantity of a liquid and particulate glass slurry within said container so as to at least cover said respective opening; said slurry having a viscosity and surface tension sufficient to penetrate and remain within the space between said one lead and respective opening;

(b) removing the liquid from said slurry to produce a particulate glass mass within at least the space between said one lead and respective opening;

(c) fuzing said particulate glass mass to produce a solid glass mass within at least the space between said one lead and respective opening;

(d) removing a sufficient portion of said solid glass mass so as to expose at least a portion of the surface of said one lead and produce a bonding surface within said container; and (e) inserting an electrical device within said space and bonding a lead wire of said electrical device to said bonding surface of said one lead.

6. A process for fabricating a hermetically sealed electrically conductive container for an electrical device of the type having at least one electrically conductive lead positioned within a respective opening formed in said container, comprising the following steps:

(a) placing a preselected quantity of a liquid and particulate glass slurry within said container so as to at least cover said respective opening, said slurry having a viscosity and surface tension sufficient to penetrate and remain within the space between said one lead and respective opening;

(b) removing the liquid from said slurry to produce a particulate glass mass within at least the space between said one lead and respective opening;

(c) fuzing said particulate glass mass to produce a solid glass mass within at least the space between said one lead and respective opening;

(d) removing a sufficient portion of said solid glass mass so as to produce a desired space within said container and to expose at least a portion of the surface of said one lead and produce a bonding surface within said container;

(e) inserting an electrical device within said space of said container and securing said electrical device to said container; and (f) bonding a lead wire of said electrical device to said bonding surface of said one lead.

7. A process for fabricating a hermetically sealed electrically conductive container for an electrical device of the type having at least one electrically conductive lead positioned within a respective opening formed in said container, comprising the following steps:

(a) placing a preselected quantity of a liquid and particulate glass slurry within said container so as to at least cover said respective opening, said slurry having a viscosity and surface tension sufficient to penetrate and remain within the space between said one lead and respective opening;

(b) removing the liquid from said slurry to produce a particulate glass mass within at least the space between said one lead and respective opening;

(c) fuzing said particulate glass mass to produce a solid glass mass within at least the space between said one lead and respective opening;

(d) removing a sufficient portion of said solid glass mass so as to produce a desired space within said container and to expose at least a portion of the surface of said one lead and produce a bonding surface within said container;

(e) inserting an electrical device within said space of said container and securing said electrical device to said container;

(f) bonding a lead wire of said electrical device to said bonding surface of said one lead; and (g) securing a cover to said container to hermetically seal said electrical device therein.

8. A process for fabricating hermetically sealed container for a semiconductor device of the type having at least one metallic lead positioned within a respective opening formed in said container, comprising the following steps:

(a) substantially filling said container with a preselected quantity of a liquid and particulate glass slurry, said slurry having a viscosity and surface tension sufficient to penetrate and remain within the space between said one lead and respective opening;

(b) evaporating the liquid from said slurry to produce a particulate glass mass within at least a portion of said container and within the space between said one lead and respective opening;

(c) fuzing said particulate glass mass to produce a solid glass mass within at least a portion of said container and within the space between said one lead and respective opening;

(d) removing a sufficient portion of the solid glass mass within said container so as to expose at least a portion of the inner surface of said container and produce a desired space therein, and to expose at least a portion of the surface of said one lead and produce a bonding surface thereon;

(e) inserting a semiconductor device within said space of said container;

(f) securing said semiconductor device to said exposed inner surface of said container; and (g) bonding a lead wire of said semiconductor device to said bonding surface of said one lead.

References Cited

UNITED STATES PATENTS

| | | | |
|---|---|---|---|
| 2,560,593 | 7/1951 | Pask et al. | 65—43 |
| 3,029,559 | 4/1962 | Treptow | 65—43 X |
| 3,166,396 | 1/1965 | Miller et al. | 65—154 X |
| 3,325,586 | 6/1967 | Suddick | 65—43 X |

S. LEON BASHORE, Primary Examiner

JOHN H. HARMAN, Assistant Examiner

U.S. Cl. X.R.

65—42, 155